United States Patent
Lee et al.

(10) Patent No.: US 6,893,944 B2
(45) Date of Patent: May 17, 2005

(54) METHOD OF MANUFACTURING A SEMICONDUCTOR WAFER

(75) Inventors: Dong Ho Lee, Seongnam-Shi (KR); Noh Yeal Kwak, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/613,616

(22) Filed: Jul. 3, 2003

(65) Prior Publication Data

US 2004/0014301 A1 Jan. 22, 2004

(30) Foreign Application Priority Data

Jul. 16, 2002 (KR) ................................ 10-2002-0041656

(51) Int. Cl.[7] .............................................. H01L 21/322
(52) U.S. Cl. ....................................... 438/473; 438/795
(58) Field of Search ................................ 438/143, 471, 438/473, 477, 795, 974

(56) References Cited

U.S. PATENT DOCUMENTS

| | | | | |
|---|---|---|---|---|
| 4,851,358 A | * | 7/1989 | Huber | 438/795 |
| 5,401,669 A | * | 3/1995 | Falster et al. | 438/476 |
| 6,191,010 B1 | * | 2/2001 | Falster | 438/471 |

\* cited by examiner

*Primary Examiner*—Chandra Chaudhari
(74) *Attorney, Agent, or Firm*—Marshall, Gerstein & Borun LLP

(57) ABSTRACT

Disclosed is a method of manufacturing a semiconductor wafer. In the present invention, a nucleation site is formed in a region deep into the wafer through low-temperature annealing process, and oxygen or precipitation material, the metallic impurity, or the like is trapped in the nucleation site through rapid thermal annealing process. As a gettering effect is improved using the rapid thermal annealing process, the concentration of the impurity on the surface of the wafer can be lowered and the reliability of the device could be improved. Further, the annealing steps can be reduced than the prior art and the productivity of the device can thus be increased.

6 Claims, 1 Drawing Sheet

METHOD OF MANUFACTURING A SEMICONDUCTOR WAFER

BACKGROUND OF THE INVENTION

1. Field of the Invention

The present invention relates to a method of manufacturing a wafer used to manufacture semiconductor devices, and more particularly, to a method of manufacturing a semiconductor wafer capable of manufacturing high-quality devices by shortening time taken to manufacture the wafer and improving the concentration of an impurity.

2. Background of the Related Art

Recently, as semiconductor devices become rapidly ultra-higher integrated and the hole of the wafers become rapidly larger, a technology to improve the quality of the wafer for manufacturing the semiconductor devices becomes an important problem. If there exists even the minimum of an impurity, lattice defect, and the like in the wafer of a device-driven region, it is required that generation of these impurity, lattice defect, etc. be prohibited or removed in a process of manufacturing the wafer since they greatly affects electrical characteristics of the device.

In a prior art, the impurity, the lattice defect, and the like existing in the wafer were removed using internal gettering through three step annealing processes, as shown in FIG. 1.

There are a large amount of supersaturated oxygen in a single crystal silicon wafer grown by Czochralski method. Therefore, in order to diffuse oxygen existing on the surface of the wafer, the wafer is loaded into the furnace and is then annealed at a temperature of 1000~1200° C. for 1~2 hours. Next, the wafer is annealing at a temperature of 650~850° C. for 3~10 hours to form a nucleation site at a region deep into the wafer. Thereafter, if the wafer is annealing at a temperature of 900~1000° C. for 1~4 hours, oxygen precipitation material, an metallic impurity, or the like are trapped in the nucleation site, so that a defect layer is formed at a region deep into the wafer.

As described above, in the prior art, the concentration of oxygen in the device-driven region is controlled by forming a defect layer in which the oxygen precipitation material, the metallic impurity, etc. are gettered at a desired region of the wafer, i.e. outside the device-driven region through three-step annealing processes of high-temperature, low temperature and medium temperature. At this time, the size and location of the defect layer may be artificially adjusted depending on the annealing temperature and time. If the conventional method is used, however, there is a disadvantage that the productivity is low since many annealing steps are required, lots of time is wasted and lots of time is also taken to manufacture the wafer.

SUMMARY OF THE INVENTION

Accordingly, the present invention is contrived to substantially obviate one or more problems due to limitations and disadvantages of the related art, and an object of the present invention is to provide a method of manufacturing a semiconductor wafer by which a defect layer is formed through two-step processes consisting of low-temperature annealing and rapid thermal annealing.

In a preferred embodiment, the method of manufacturing the semiconductor wafer according to the present invention is characterized in that it comprises the steps of annealing a wafer at a low temperature in order to form a nucleation site at a region deep into the wafer, and performing rapid thermal annealing process so that oxygen precipitation material, metallic impurity, etc. is trapped in the nucleation site In the above, the low-temperature annealing process is performed at a temperature of 650~850° C. under nitrogen ($N_2$) atmosphere for 3~10 hours. Also, the rapid thermal annealing process is performed at a temperature of 1000~1200° C. under nitrogen ($N_2$) atmosphere for 10 seconds~5 minutes.

Further, the method further comprises the step of before the low-temperature annealing process is implemented, performing high-temperature annealing process in order to diffuse oxygen existing on the surface of the wafer toward the outside. Also, the low-temperature annealing process is performed at a temperature of 1000~1200° C. under dry oxygen ($O_2$) atmosphere for 1~2 hours.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1:
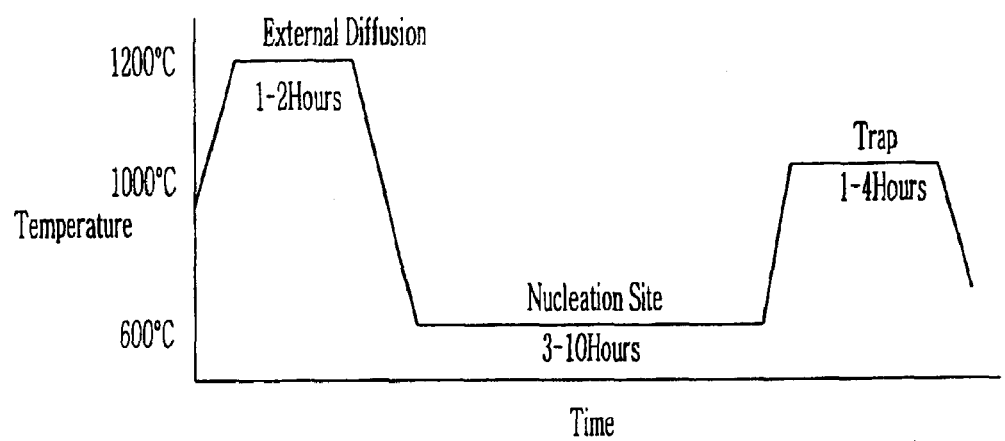
FIG. 1 illustrates a process for explaining a conventional method of manufacturing a semiconductor wafer.
Figure 2:
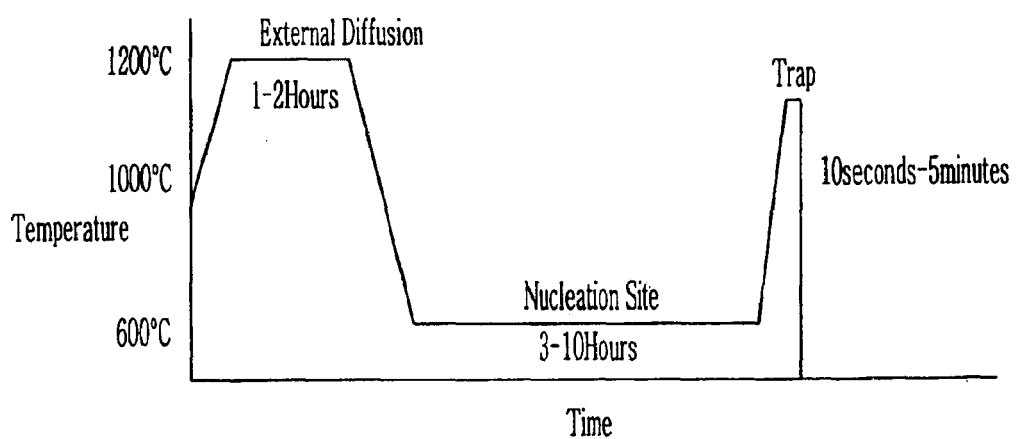
FIG. 2 illustrates a process for explaining a method of manufacturing a semiconductor wafer according to the present invention.

FIG. 2 illustrates a process for explaining a method of manufacturing a semiconductor wafer according to the present invention.

1 Step: A single crystal silicon wafer grown by Czochralski method is loaded into a furnace. The wafer is then annealed under a nitrogen ($N_2$) or dry oxygen ($O_2$) atmosphere at a temperature of 1000~1200° C. for 1~2 hours so that oxygen existing on the surface of the wafer is diffused into the outside. Thereby the concentration of oxygen on the surface of the wafer is reduced. At this time, the concentration of oxygen has distribution in which the concentration of oxygen is gradually increased in a direction of the wafer depth.

2 Step: The wafer is annealed under a nitrogen ($N_2$) atmosphere at a temperature of 650~850° C. for 3~10 hours, thus forming a nucleation site at a region deep into the wafer. At this time, the critical size of created precipitation material is varied depending on the concentration of oxygen decided by the annealing process in Step 1. The critical value of the precipitation material has distribution that is gradually reduced in a depth direction of the wafer.

3 Step: The wafer is experienced by rapid thermal annealing process under nitrogen (N$_2$) at a temperature of 1000~1200° C. atmosphere for 10 seconds~5 minutes, so that oxygen precipitation material, a metallic impurity, or the like is trapped in the nucleation site. A defect layer is thus formed at a region deep into the wafer. During the rapid thermal annealing process, a step-up temperature rate is 30~200° C./sec, a cooling rate is 200~100° C./sec and the flux of nitrogen (N$_2$) is 1~20 slpm.

In other words, as a result of comparing a case that the wafer is annealed at a temperature of 1000° C. for 1 hour with a case of the rapid thermal annealing at a temperature of 1050° C. for 30 seconds, it was found that an oxygen gettering effect is similar. In case of the rapid thermal annealing, however, the defect layer is formed more at more deeper region. Therefore, the concentration of the impurity on the surface of the wafer is lower than a case annealed in the furnace.

Further, according to the present invention, oxygen existing on the surface of the wafer is diffused toward the outside or gettered to the defect layer through the three-step rapid thermal annealing processes. Due to this, the first annealing step ma be omitted.

As described above, according to the present invention, the nucleation site is formed in the region deep into the wafer through the low-temperature annealing process, and oxygen or precipitation material, the metallic impurity, or the like is trapped in the nucleation site through the rapid thermal annealing process. Therefore, the present invention has advantageous effects that it can lower the concentration of the impurity on the surface of the wafer and thus improve the reliability of the device, since the gettering effect is improved using the rapid thermal annealing process. Further, the present invention has an advantageous effect that it can reduce the annealing steps than the prior art and thus improve the productivity of the device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a semiconductor wafer, comprising the steps of:

annealing a wafer at a low temperature under nitrogen (N$_2$) atmosphere in order to form a nucleation site at a region deep into the wafer; and performing a rapid thermal annealing process under nitrogen (N$_2$) atmosphere after forming the nucleation site so that oxygen precipitation material or metallic impurity is trapped in the nucleation site.

2. The method as claimed in claim 1, wherein the low-temperature annealing process is performed at a temperature of 650~850° C. 3~10 hours.

3. The method as claimed in claim 1, wherein the rapid thermal annealing process is performed at a temperature of 1000~1200° C. for 10 seconds~5 minutes.

4. The method as claimed in claim 1, wherein in the rapid thermal annealing process, a step-up rate is 30~200° C./sec, a cooling rate is 200~100° C./sec and the flux of nitrogen (N$_2$) is 1~20 slpm.

5. The method as claimed in claim 1, further comprising the step of before the low-temperature annealing process is implemented, performing high-temperature annealing process in order to diffuse oxygen existing on the surface of the wafer toward the outside.

6. The method as claimed in claim 5, wherein the high-temperature annealing process is performed at a temperature of 1000~1200° C. under dry oxygen (O$_2$) atmosphere for 1~2 hours.

* * * * *

UNITED STATES PATENT AND TRADEMARK OFFICE
CERTIFICATE OF CORRECTION

PATENT NO. : 6,893,944 B2
DATED : May 17, 2005
INVENTOR(S) : Dong H. Lee et al.

It is certified that error appears in the above-identified patent and that said Letters Patent is hereby corrected as shown below:

<u>Title page,</u>
Item [57], ABSTRACT,
Line 10, please delete "than" and replace with -- then --.

<u>Column 4,</u>
Line 21, please delete "650~850º C." and replace with -- 650~850ºC --.
Line 24, please delete "1000~1200º C." and replace with -- 1000~1200ºC --.
Line 26, please delete "30~200º C./sec, a cooling rate is 200~100ºC./sec" and replace with -- 30~200ºC/sec, a cooling rate is 200~100ºC/sec --.
Line 30, please delete "step of before" and replace with -- step before --.
Line 36, please delete "1000~1200º C." and replace with -- 1000~1200ºC --.

Signed and Sealed this

Twenty-seventh Day of September, 2005

JON W. DUDAS
*Director of the United States Patent and Trademark Office*